United States Patent [19]
Gut et al.

[11] Patent Number: 4,810,322
[45] Date of Patent: Mar. 7, 1989

[54] ANODE PLATE FOR A PARALLEL-PLATE REACTIVE ION ETCHING REACTOR

[75] Inventors: George M. Gut; Steven E. Monahan, both of Rochester, Minn.

[73] Assignee: International Business Machines Corporation, Armonk, N.Y.

[21] Appl. No.: 926,299

[22] Filed: Nov. 3, 1986

[51] Int. Cl.$^4$ ................... B44C 1/22; C03C 25/06; C03C 15/00
[52] U.S. Cl. .................... 156/345; 156/643; 156/646; 204/298
[58] Field of Search ............... 156/345, 435, 643, 646; 204/192.11, 298; 219/121 PD, 121 PG

[56] References Cited

U.S. PATENT DOCUMENTS

| | | | |
|---|---|---|---|
| 4,209,357 | 6/1980 | Gorin et al. | 156/643 |
| 4,230,515 | 10/1980 | Zajac | 156/345 |
| 4,297,162 | 10/1981 | Mundt et al. | 156/643 |
| 4,307,283 | 12/1981 | Zajac | 219/121 PG |
| 4,352,725 | 10/1982 | Tsukada | 204/192 E |
| 4,411,733 | 10/1983 | Macklin et al. | 156/345 X |
| 4,491,496 | 1/1985 | Laporte et al. | 156/345 |
| 4,512,283 | 4/1985 | Bonifield et al. | 118/723 |
| 4,595,484 | 6/1986 | Giammarco et al. | 156/345 |
| 4,600,464 | 7/1986 | Desilets et al. | 156/345 |
| 4,601,807 | 7/1986 | Lo et al. | 156/345 |
| 4,612,432 | 9/1986 | Sharp-Geiscer | 156/345 |

Primary Examiner—William A. Powell
Attorney, Agent, or Firm—Bradley A. Forrest

[57] ABSTRACT

An anode for a reactive ion etching (RIE) system has a plurality of holes formed therethrough. The holes produce a plasma glow about each hole which results in an increase in the etch rate of wafers to be etched on a cathode opposite the holes. The holes are arranged in the anode to provide a uniform etch rate on one wafer or a batch of wafers to be etched. By varying the pressure in the system, the presence of plasma glow and hence the etch rate uniformity is controlled.

12 Claims, 4 Drawing Sheets

PRIOR RESULTS

RESULTS WITH IMPROVED SYSTEM

ANODE PLATE FOR A PARALLEL-PLATE REACTIVE ION ETCHING REACTOR

BACKGROUND OF THE INVENTION

The present invention relates to parallel plate reactive ion etching, and in particular to increasing the uniformity of the etch rate.

In a parallel plate reactive ion etch (RIE) device, two plates, an upper and a lower electrode plate (anode and cathode respectively) are disposed within a pressure controlled chamber. One or more wafers to be etched are placed on the lower plate and are subjected to an ion bombardment brought about by a high radio frequency (RF) voltage across the plates. An inert gas, such as $CF_4$ is introduced between the plates as a source of ions, referred to as reactive species. In the RIE process, the upper plate is grounded to the chamber, and an RF voltage source is coupled to the lower plate. This arrangement causes a self-bias of several hundred volts negative to form on the lower electrode, which accelerates the reactive gas species generated from the process gas vertically toward the wafers on the electrode. The reactive gas species thus reacts chemically and physically, as by bombardment, with the wafers. This combination of chemical/physical interaction with the wafer, using the correct process gas chemistry, results in vertical, or anisotropic etching of patterns on the wafer. There is very little sideways etching under a photoresist mask which defines the areas to be etched. Thus, fine line widths may be obtained using an RIE process.

One difficulty in the RIE process is that of obtaining a uniform etch rate of a thin film on a batch of wafers placed on the cathode. Measurements have shown that the rate of etch of the thin film can be substantially greater on wafers situated closer to the edge of the cathode compared with wafers close to the center of the cathode. The nonuniformity is often severe enough to prevent easy implementation of the RIE process in mass semiconductor manufacturing. Attempts have been made to improve uniformity of etch by improving the uniformity of process gas distribution within the RIE chamber based on the theory that local depletion of reactive species in the process gas produces different etch rates at various distances from point at which gas is introduced. Since the process gas was found not to be depleted of reactive species anywhere in the chamber, these efforts did not work. Similarly, changing the plate spacing did not change the uniformity of the etch.

Plasma etching uses a similar arrangement of plates in a chamber, but the RF source is coupled to the top plate, resulting in a different type of etch. The absence of a substantial negative self-bias on the lower plate in a plasma etching process (not using RIE) produces an isotropic reaction with the wafers which is closer to a chemical reaction. Sideways etching under the mask occurs, preventing the use of this process for fine line widths. There is no bombardment, as with an RIE process. Distribution of the species producing gas in a plasma etching process, as opposed to an RIE process, has been an important consideration. In U.S. Pat. No. 4,297,162 to Mundt et al., a top plate is seen with a plurality of holes for distribution of the gas. The holes serve no purpose other than to distribute the gas. In the Mundt et al. patent, the top plate is also curved to create a more uniform etch. There is no need for such a gas distributing mechanism in an RIE apparatus.

SUMMARY OF THE INVENTION

A reactive ion etching (RIE) system provides improved uniformity of etch rate. The RIE system has a pressure controlled chamber with a top conductive anode plate and a bottom conductive cathode plate. Wafers to be etched are placed on the bottom plate, which is also coupled to a radio frequency (RF) voltage source. A gas is introduced through a port in the chamber to provide reactive species which bombard and etch the wafer in a desired pattern. Uniformity of etch rate is provided by forming a pattern of holes in the top plate which is coupled to ground with the chamber. An enhanced plasma glow develops about the holes, causing a local increase in the generation of reactive species, resulting in a substantially uniform etch rate on the wafers.

The holes are positioned in such a way that the regions of increased etch rate resulting from each hole blend together uniformly and thus increase the overall etch rate of thin films over a large region of the lower plate. The increase in etch rate thus matches the etch rate of films near the edges of the cathode which was already higher than the etch rate near the center of the cathode. This compensation results in a very uniform rate of etch of the thin film on all wafers on the lower plate.

One desirable placement of holes in the anode is in two concentric circles, concentric with the center of the bottom plate. The enhanced plasma glow generated about each hole provides sufficient active species for uniform etching of the wafers on the bottom plate.

The pressure of the gas within the chamber is regulated to control the amount of plasma glow generated about each hole. When RF voltage is initially applied to the bottom plate, the pressure in the chamber is raised to approximately 100 mTorr to start the glow. The pressure is then lowered to a desired operating pressure (usually 10–50 mTorr) with the assurance that the enhanced plasma regions are self-sustaining. The pressure may also be reduced so that no enhanced plasma glow is attained. The plasma glow, and hence the rate of generation of reactive species is controlled by regulation of the pressure, as opposed to gas circulation, and plate spacing as in plasma etching processes. The system can etch both in uniform and prior modes of operation as controlled by the pressure. By lowering the pressure to about 10 mTorr before RF is applied, a no glow condition is achieved.

DETAILED DESCRIPTION

Figure 1:
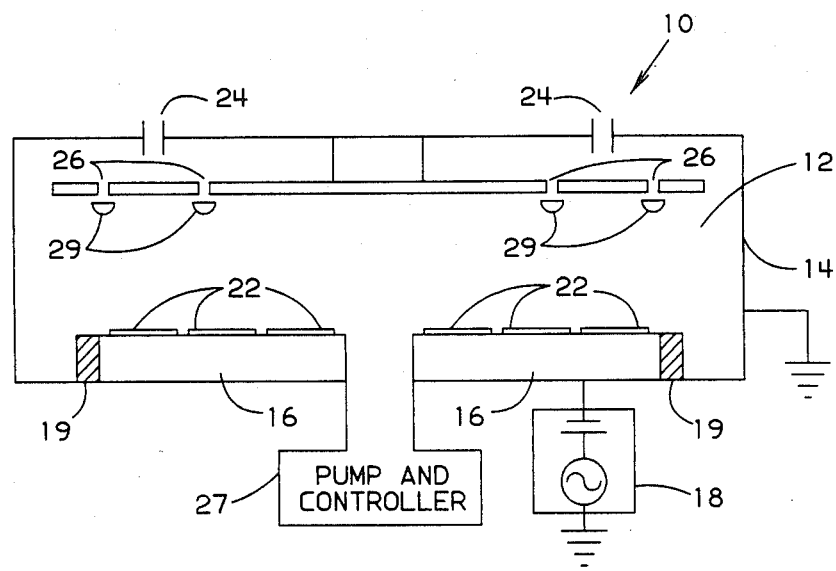
FIG. 1 is a schematic diagram the RIE system in accordance with the present invention.

A parallel plate plasma reactor is indicated generally at 10 in FIG. 1. The reactor 10 comprises an electrically conductive cylindrical chamber 12 defined by a chamber wall 14 and a bottom cathode plate 16. Cathode plate 16 is coupled to a radio frequency (RF) source 18. Cathode plate 16 is coupled to the chamber wall 14 by an electrical insulator 19. A conductive top anode plate 20 is coupled to the chamber wall 14 which in turn is grounded, thus grounding top plate 20 with respect to the RF source. The diameter of the chamber is slightly larger than the diameter of the plates 16 and 20.

A plurality of semiconductor wafers 22 are disposed on bottom plate 16 such that one flat surface of each wafer is contacting bottom plate 16 and the other flat surface, the surface to be etched, of each wafer is facing top plate 20. In one embodiment, polysilicon wafers are used. A typical process uses a layer of masking material, photoresist, which is coated on the wafer on which the polysilicon layer of approximately 5000 angstrom has been deposited. Patterns are produced in the photoresist layer by a photographic process. The photoresist left behind protects certain regions of the thin film from etching in the RIE. The photoresist is removed later in acid, eeaving behind non-etched regions of the polysilicon.

A process gas which is used to generate the chemically reactive species, such as $CF_4$ and $SiCl_4$ for polysilicon wafer etching is introduced to the chamber through gas inputs 24. A pump port 25 located in the middle of bottom plate 16 is used to control the pressure within the chamber 12. The pump port 25 is coupled to a known vacuum pump and controller 27.

When RF power at 13.56 Mhz and approximately 1000 volts peak to peak is applied to bottom plate 16 in the presence of the gas, the gas is induced to release reactive species, such as flourine from $CF_4$ and chlorine from $SiCl_4$. The reactive species bombard the wafers, etching the wafers in an anisotropic manner. This means that a vertical etch occurs in areas of the wafers which are not masked by photoresist as described above.

Other processes which are performed on the RIE include $CF_4$ and $CHF_3$ for the etch of $SiO_2$, $O_2$ for the etch of organic thin films, as well as other gases containing flourine, chlorine, and bromine reactive species. Other frequencies and magnitudes of power will provide desired results, and are known to those skilled in the art.

In the RIE system of FIG. 1, the top plate 20 is provided with one or more physical aberrations, such as aperatures 26 opening toward the bottom plate 16. When system 10 is operating, highly active plasma regions indicated at 29 are generated about the aperatures 26 between the top plate 20 and bottom plate 16. The etch rate of the wafers below the aperatures is increased, probably by the generation of a larger density of reactive etching species induced by the highly active plasma regions.

The aperatures 26 in one embodiment are ½ inch (1.27 cm) diameter perforations of top plate 20. The highly active plasma region at each aperature 26 appears visually as a glowing hemispherical region of approximately 1 inch (2.54 cm) radius surrounding the aperature 26. The region glows brighter than the plasma glow generally present during RIE processes. The spacing between the top and bottom plates is 3.5 inches (8.89 cm). Such spacing may be varied to increase or decrease the overall etch rate.

Figure 2:
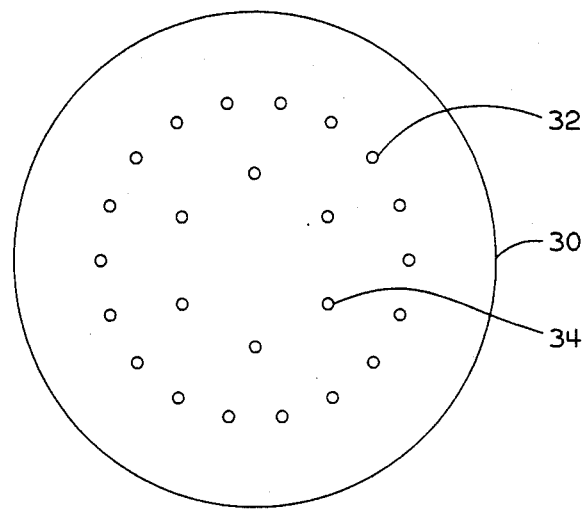
FIG. 2 is a top view of a top plate in the system of FIG. 1.

One desired pattern of aperatures is indicated in FIG. 2. Two concentric circles of aperatures are provided on a top plate 30 in FIG. 2. An outer circle of aperatures 32 comprise an aperature every 20 degrees (0.349 radians) at a distance of 7.75 inches (19.69 cms) from the center of a 27 inch (68.58 cm) diameter top plate. An inner circle of aperatures 34 comprise an aperature every 60 degrees (1.047 radians). The aperatures 32 provide an increased etch rate. The arrangement of the aperatures, and the corresponding increase in etch rate beneath them provides a more uniform etching than that provided by the prior smooth top plate. The prior smooth plate exhibited an etch rate approximately 70 percent higher under its outer edges than under areas near its center under various normal operating conditions. The improved plate with the aperatures, provide an etch rate over the entire surface closer to the higher etch rate under the outer edges of the prior plate.

The parallel plate plasma reactor incorporates a silicon bottom plate and an aluminum top plate. RIE multiwafer etching tools are well known in the art and are available from Plasma Therm, Inc., manufacturing Batch Systems 2484, 2482, 2486, and Tylan/Tokuda, manufacturing Batch Systems TRIE-608, TRIE-555, TRIE-303.

Single wafer RIE tools may also benefit from the improvement.

While the aperatures have been described in terms of being round openings in the top plate, other openings of varied geometry are within the scope of the invention. Square or triangular openings would likely provide similar enhanced plasma glow. The provision of a chamfer on the openings is also contemplated. The geometric distribution may be varied by simple experiment to arrive at different desired etch rate distributions on single large wafers, or multiple wafers as shown. While the size of the aperatures has been precisely described, different size aperatures are also contemplated.

Further physical aberrations in the top plate 30 may also produce the desired plasma glow. Such aberrations may include holes of similar diameter opening toward the bottom plate, but not extending all the way through top plate 30. Another possibility is a protrusion from plate 30 toward the bottom plate. Any type of aberration which produces an area of increased plasma glow may be used to increase the etch rate. It is then a simple matter of minor experimentation to determine the size, pattern and mixture of such aberrations to provide desired etch rates over the bottom plate. Such etch rates need not be uniform in the event that a uniform rate is not desired, but the aberrations provide an excellent means of providing a uniform etch rate.

Figure 3:
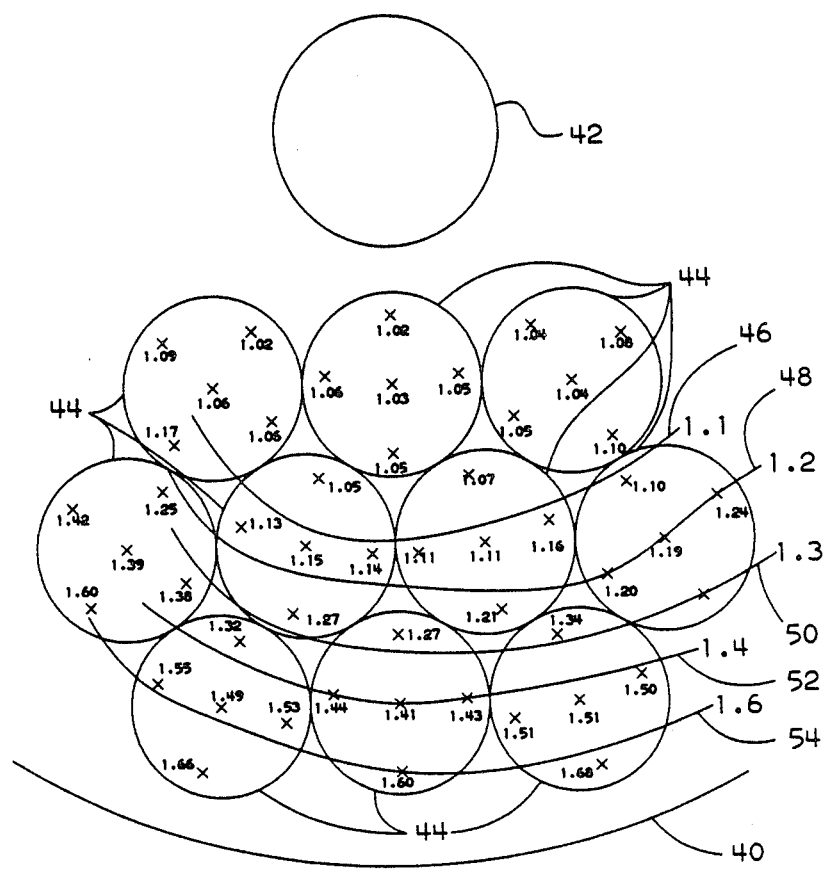
FIG. 3 is a top view of a bottom plate of a prior art system, showing normalized depth of etch of a thin polysilicon film.

FIG. 3 is a top view representation of a section of a bottom plate 40 having a pump port 42, and a plurality of wafers 44 placed on it. Ten, 3¼ inch (8.26 cm) polysilicon wafers have been subjected to etching by flourine ions with a top electrode of the dimensions previously stated, but without aperatures. The etch time was sufficient to remove approximately 50 percent of polysilicon film thickness to permit pre and post etch thin film thickness measurements from which etch uniformity was calculated. The pressure in the RIE chamber was 40 mTorr. The process gas was a mixture of $CF_4$ and $SiCl_4$. There was a negative self bias on the cathode of −400 volts.

Five etch depths per wafer 44 were measured at locations identified by an "x". A normalized etch depth is associated with each location. The rate of etching was greatest near the circumference of the plate 40, as indicated by higher normalized etch depths.

The normalized depth of etching ranges from about 1.02 near the pump port 42 to 1.68 near the circumference. A line 46, which is approximately a semicircle indicates an average etch depth of 1.1. Lines 48, 50, 52, and 54, each a semicircle centered about the pump port 42 and having increasing radii, indicate average normalized depths of 1.2, 1.3, 1.4, and 1.6. Lines 46–54 indicate a well defined gradient of etch rate which is lowest near the center of plate 40 and higher near its circumference.

Figure 4:
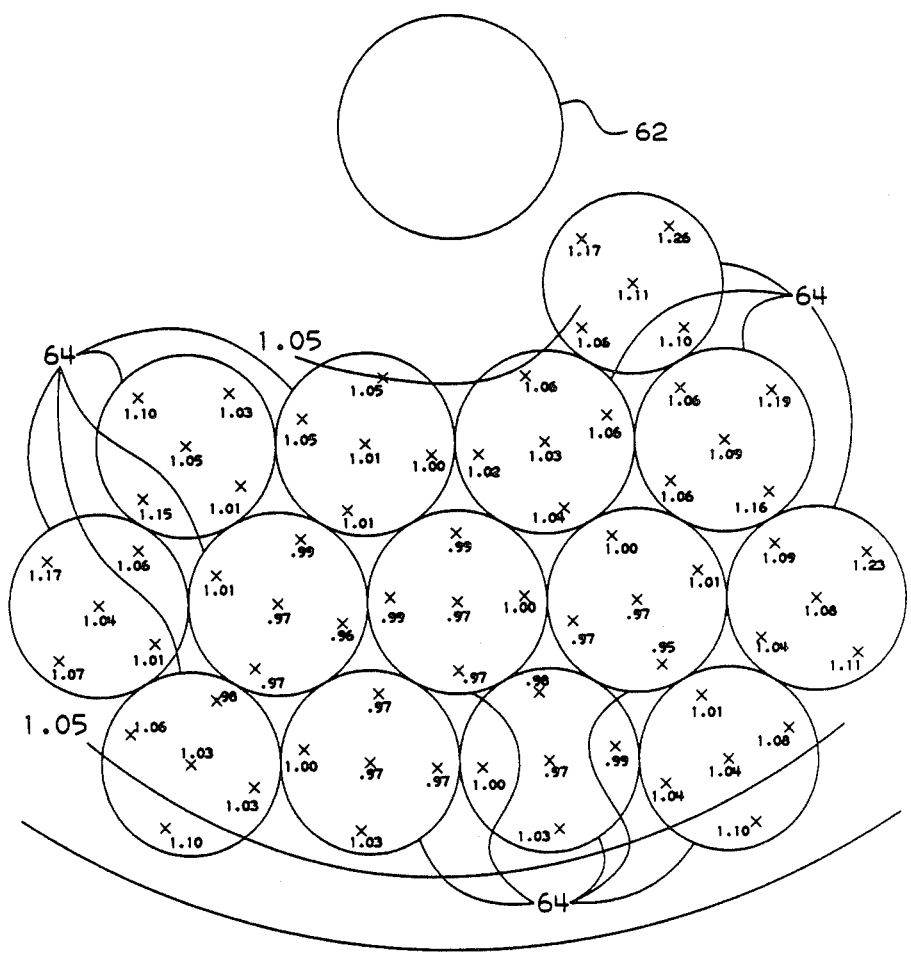
FIG. 4 is a top view of the bottom plate of the system of FIG. 1 showing normalized depth of etch on a plurality of etched wafers.

In FIG. 4, a section of a bottom plate 60 having a pump port 62 also shows normalized etch depths for a plurality of wafers 64. Under the same etching conditions, but with a top plate having the aperatures as indicated in FIG. 2, a much more uniform etch rate was obtained. With the same operating chemistry and voltage, pressure in the chamber was momentarily raised to 100 mTorr to start the glow about each hole. The pressure was then lowered to 40 mTorr after 2 to 3 seconds.

Figure 5:
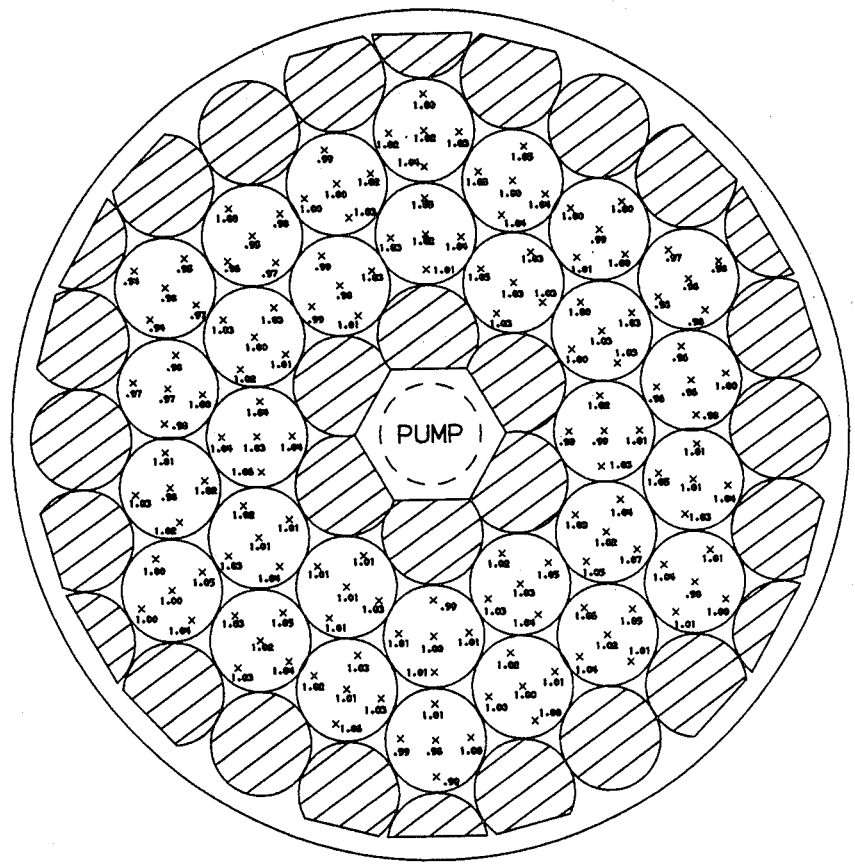
FIG. 5 is a further top view of the bottom plate of the system of FIG. 1 showing normalized depth of etch on a plurality of etched wafers wherein dummy wafers are employed adjacent edges of wafers to be etched.

Results depicted in FIG. 5 appear better than those in FIG. 4. This is because dummy wafers were employed next to wafers to be etched that did not have neighbor wafers to be etched. In FIG. 4, edges of the wafers with no neighbors show a somewhat higher etch rate than the normalized etch rate. This is a typical result in an RIE process. During actual production processing, as in FIG. 5, all wafers have neighbors, even if dummy wafers are employed. The results in FIG. 5 are representative of an average run using the anode of FIG. 2. The uniformity is typical, and does not vary significantly when operating parameters are varied. The uniformity is primarily a function of the holes in the upper plate, rather than the from any precise combination of parameters, such as voltage, pressure, or gas concentration.

One important benefit, besides the greatly increased uniformity of etch rate, is the increase in speed provided. Since all the wafers are etched at the same higher rate of etching that occurred only near the edges of the plates in the prior art, throughput in processing batches of wafers is increased. The invention makes the RIE process practical for use in mass production, thus providing the benefit of an anisotropic etch. Such an etch assists in further reducing line widths obtainable in mass production.

What is claimed is:

1. A reactive ion etching system comprising:
a chamber;
supply means for providing gas within said chamber at desired pressures;
a bottom electrode in said chamber for holding material to be etched;
means coupled to the bottom electrode for providing radio frequency power to the bottom electrode; and
a top electrode in said chamber, substantially parallel to said top electrode having at least one aperture therethrough for providing a plasma glow for increasing the etch rate of the material below said aperture.

2. The system of claim 1 and further comprising a pump means coupled to said chamber for controlling the pressure of the reactive gas within the chamber.

3. The system of claim 2 wherein the pump means controls the presence of plasma glow about the at least one aperture by varying the pressure of the reactive gas within the chamber.

4. The system of claim 1 wherein the top electrode has a plurality of aperture therethrough positioned above the material to be etched such that the etch rate of the material is substantially uniform.

5. A reactive ion etching system comprising:
a sealed chamber;
supply means for providing a reactive gas within said chamber at controllable pressures;
a bottom electrode in said chamber for holding material to be etched;
means for coupling a radio frequency power source to the bottom electrode; and
a top electrode in said chamber, substantially opposite said bottom electrode and electrically coupled to said chamber, said top electrode having at least one aberration therein for providing a plasma glow thereby increasing the etch rate of the material below said aberration.

6. The system of claim 5 wherein the top electrode has a plurality of aberrations equally space in a circle centered about the center of the top electrode.

7. The system of claim 6 wherein the top electrode has at least one further circle of equally spaced aberrations concentric with the other circle.

8. The system of claim 6 wherein each aberration comprises a circular hole formed through the top electrode.

9. A reactive ion etching system for etching a material comprising:
a chamber;
supply means for providing a reactive gas within said chamber;
means for controlling the pressure of gas within said chamber;
a first electrode disposed in said chamber;
means for coupling a radio frequency power source to the first electrode; and
a second electrode disposed in said chamber, substantially opposite said first electrode and electrically coupled to said chamber, said second electrode having at least one aberration therein for providing a plasma glow thereby increasing the etch rate of material placed proximate said first electrode.

10. The system of claim 9 wherein the second electrode has a plurality of aberrations equally spaced in a circle centered about the center of the second electrode.

11. The system of claim 10 wherein the second electrode has at least one further circle of equally spaced aberrations concentric with the other circle.

12. The system of claim 10 wherein each aberration comprises a circular hole formed through the top electrode.

* * * * *